United States Patent
Chou

(10) Patent No.: US 10,642,671 B2
(45) Date of Patent: May 5, 2020

(54) TESTING APPARATUS AND FOLDED PROBE CARD TESTING SYSTEM

(71) Applicant: ELITE SEMICONDUCTOR MEMORY TECHNOLOGY INC., Hsinchu (TW)

(72) Inventor: Min-Chung Chou, Hsinchu (TW)

(73) Assignee: ELITE SEMICONDUCTOR MEMORY TECNOLOGY INC., Hsinchu (TW)

( * ) Notice: Subject to any disclaimer, the term of this patent is extended or adjusted under 35 U.S.C. 154(b) by 260 days.

(21) Appl. No.: 15/902,688

(22) Filed: Feb. 22, 2018

(65) Prior Publication Data

US 2019/0258537 A1     Aug. 22, 2019

(51) Int. Cl.
| | | |
|---|---|---|
| *G01R 33/07* | (2006.01) | |
| *G06F 11/07* | (2006.01) | |
| *G01R 1/073* | (2006.01) | |
| *G01R 1/067* | (2006.01) | |
| *G01R 31/28* | (2006.01) | |

(52) U.S. Cl.
CPC ...... *G06F 11/0745* (2013.01); *G01R 1/06733* (2013.01); *G01R 1/06766* (2013.01); *G01R 1/07342* (2013.01); *G01R 1/07357* (2013.01); *G01R 31/2889* (2013.01)

(58) Field of Classification Search
CPC ............ G01R 31/2889; G01R 1/07357; G01R 1/07342; G01R 1/06733; G01R 33/0082; G01R 33/07; G06F 11/0745; G11C 29/1201; G11C 29/36

USPC ............. 324/756.03, 437, 445, 446, 754.01, 324/754.03–754.12, 754.21–755.01, 324/755.11, 758.01, 690, 696, 716, 724; 709/204, 217, 205, 206

See application file for complete search history.

(56) References Cited

U.S. PATENT DOCUMENTS

| | | | |
|---|---|---|---|
| 7,122,442 B2 * | 10/2006 | Cleavelin | H01L 21/26506 438/406 |
| 7,880,486 B2 * | 2/2011 | Miller | G01R 31/31905 324/754.03 |
| 7,906,982 B1 * | 3/2011 | Meade | G01R 31/318511 324/754.01 |
| 8,373,432 B2 * | 2/2013 | Johnson | G01R 31/31905 324/754.07 |

(Continued)

*Primary Examiner* — Jermele M Hollington
*Assistant Examiner* — Taqi R Nasir
(74) *Attorney, Agent, or Firm* — Juan Carlos A. Marquez; Marquez IP Law Office, PLLC

(57) ABSTRACT

A testing apparatus has first and second IOs, first and second comparators, a data combining module, and first and second data output circuits. The first and second comparators respectively receive first and second test data. The data combining module electrically connected to the first and second comparators receive compared first and second test data of the first and second comparators, and further receive a command code. The first and second data output circuits are respectively connected to the first and second IOs, and are further electrically connected to the data combining module. According to the command code, the data combining module outputs the compared first and second test data respectively to the first and second IOs through the first and second data output circuits, or respectively to the second and first IOs through the second and first data output circuits.

12 Claims, 4 Drawing Sheets

(56) References Cited

U.S. PATENT DOCUMENTS

| | | | | |
|---|---|---|---|---|
| 8,650,566 B2* | 2/2014 | Vaghani | ............... | G06F 3/0617 |
| | | | | 718/1 |
| 8,671,154 B2* | 3/2014 | Davis | ............... | H04L 29/12028 |
| | | | | 709/204 |
| 8,922,230 B2* | 12/2014 | Wang | ............... | G01R 1/07378 |
| | | | | 324/754.03 |
| 2003/0210031 A1* | 11/2003 | Miller | ............... | G01R 1/07378 |
| | | | | 324/756.03 |

* cited by examiner

TESTING APPARATUS AND FOLDED PROBE CARD TESTING SYSTEM

TECHNICAL FIELD

The present disclosure relates to a testing apparatus and a folded probe card testing system using the testing apparatus, and in particular to a testing apparatus which has the flexibility for probe cards of one and multiple input-outputs (IO).

RELATED ART

When testing integration circuits (ICs) on a wafer, it is cost effective to test as many devices as possible in parallel, thus reducing the test time per wafer. Test system controllers have evolved to increase the number of channels and hence the number of devices that can be tested in parallel. However, a test system controller with increased test channels is a significant cost factor for a test system, as is a probe card with complex routing lines used to accommodate multiple parallel test channels. It is, thus, desirable to provide an overall probe card architecture that allows increased test parallelism without requiring increased test system controller channels and without increased probe card routing complexity.

Referring to FIG. 1, FIG. 1 is a block diagram of a conventional testing apparatus in a testing system. The conventional testing apparatus 1 comprises multiple comparators 111, 112 and multiple data output circuits 121, 122, wherein each of the comparators 111, 112 is electrically connected to a corresponding one of the data output circuits 121, 122 by a one-to-one manner.

Each of the comparators 111, 112 receives corresponding one of test data DG_1, DG_2. Each of the comparators 111, 112 compares the received the test data DG_1, DG_2 and outputs compared test data to the corresponding one of the data output circuits 121, 122. Then, the data output circuits 121, 122 respectively output compared test data at their output ends DQ1, DQ2. The conventional testing apparatus 1 adopts a multiple IO configuration (i.e. 2 IO configuration), and this may increase routing complexity of the probe card.

Referring to FIG. 2, FIG. 2 is a block diagram of another one a conventional testing apparatus in a testing system. The conventional testing apparatus 2 comprises multiple comparators 211, 212, a data combiner 22 and a data output circuit 23, wherein the comparators 211, 212 are electrically connected to the data combiner 22, and the data combiner 22 is electrically connected to the data output circuit 23.

Each of the comparators 211, 212 receives a corresponding one of test data DG_1, DG_2. Each of the comparators 211, 212 compares the received the test data DG_1, DG_2 and outputs compared test data to the data combiner 22. The data combiner 22 further receives a command code CY[1:0] and outputs the compared test data of the comparator 211, the compared test data of the comparator 212 or the combination of the compared test data of the comparators 211 and 212 to the data output circuit 23 according to the command code CY[1:0].

For example, when the command code CY[1:0] is "00", the data output circuit 23 outputs the combination of the compared test data of the comparators 211 and 212 at its output end DQ1. When the command code CY[1:0] is "10", the data output circuit 23 outputs the compared test data of the comparator 211 at its output end DQ1, and when the command code CY[1:0] is "01", the data output circuit 23 outputs the compared test data of the comparator 212 at its output end DQ1. The conventional testing apparatus 2 adopts a one IO configuration (i.e. 1 IO configuration), and this may result in having to require a testing controller and in the apparatus not being applicable for the probe card of multiple IOs.

SUMMARY

One objective of the present invention is to provide a testing apparatus which can be applicable to both the testing systems for one and multiple IOs (i.e., flexibility for probe cards of one and multiple IOs).

Another objective of the present invention is to provide a folded probe card testing system which uses the testing apparatus for a normal test mode.

To achieve at least the above objectives, the present invention provides a testing apparatus, comprising: a first input-output (IO) and a second IO; a first comparator, receiving first test data; a second comparator, receiving second test data; a data combining module, electrically connected to the first and second comparators, receiving compared first test data of the first comparator and compared second test data of the second comparator, and further receiving a command code; a first data output circuit, electrically connected to the first IO and the data combining module; a second data output circuit, electrically connected to the second IO and the data combining module; wherein according to the command code, the data combining module outputs the compared first test data and the compared second test data respectively to the first and second IOs through the first and second data output circuits, or the compared second test data and the compared first test data respectively to the first and second IOs through the first and second data output circuits.

In one embodiment of the present invention, according to the command code, the data combining module outputs combination of the compared first test data and the compared second test data to the first and second IOs through the first and second data output circuits.

In another embodiment of the present invention, the data combining module comprises a first and second data combiners, the first and second comparators are electrically connected to all of the first and second data combiners, and the first and second data combiners are respectively connected to the first and second data output circuits, wherein the command code is applied to the first and second data combiners.

In a further embodiment of the present invention, the testing apparatus further comprises: a third and fourth IOs; a third and fourth data output circuits, respectively electrically connected to the third and fourth IOs, and further electrically connected to the data combining module; wherein according to the command code, the data combining module outputs the compared first test data of the first comparators to the first and third IOs through the first and third data output circuits, and the compared second test data of the second comparators to the second and fourth IOs through the second and fourth data output circuits, or outputs the compared first test data of the first comparators to the second and fourth IOs through the second and fourth data output circuits, and the compared second test data of the second comparators to the first and third IOs through the first and third data output circuits, or outputs combination of the compared first test data and the compared second test data to the first through fourth IOs through the first and fourth data output circuits.

In a further embodiment of the present invention, the testing apparatus further comprises: a third and fourth IOs; a third through eighth comparators, respectively receiving third through eighth test data; and a third and fourth data output circuits, respectively electrically connected to the third and fourth IOs, and further electrically connected to the data combining module; wherein according to the command code, the data combining module outputs four of the compared first through eighth test data of the first through eighth comparators to the first through fourth IOs through the first through fourth data output circuits.

In an even further embodiment of the present invention, the data combining module comprises a first through fourth data combiners, the first through eighth comparators are electrically connected to all of the first through fourth data combiners, and the first through fourth data combiners are respectively connected to the first through fourth data output circuits, wherein the command code is applied to the first through fourth data combiners.

To achieve at least the above objectives, the present invention provides a testing apparatus, comprising: a first through fourth IOs; a first comparator, receiving $i^{th}$ test data from a chip die; a second comparator, receiving $(i+1)^{th}$ test data from the chip die; a data combining module, electrically connected to the first and second comparators, receiving compared $i^{th}$ test data of the first comparator and compared $(i+1)^{th}$ test data of the second comparator, and further receiving a command code; first through fourth data output circuits, electrically connected to the data combining module, and respectively electrically connected to the first through fourth IOs; wherein according to the command code, the data combining module outputs the compared $i^{th}$ test data to the first and third IOs through the first and third data output circuits and the compared $(i+1)^{th}$ test data to the second and fourth IOs through the second and fourth data output circuits, or outputs the compared $(i+1)^{th}$ test data to the first and third IOs through the first and third data output circuits and the compared $i^{th}$ test data to the second and fourth IOs through the second and fourth data output circuits, wherein i is an odd-numbered integer and i+1 is not larger than a number of the outputs of the chip die.

To achieve at least the above objectives, the present invention provides a folded probe card testing system, comprising: a testing apparatus; and a folded probe card, electrically connected to the testing apparatus; wherein the testing apparatus comprises: a first through fourth IOs; a first comparator, receiving $i^{th}$ test data from a chip die; a second comparator, receiving $(i+1)^{th}$ test data from the chip die; a data combining module, electrically connected to the first and second comparators, receiving compared $i^{th}$ test data of the first comparator and compared $(i+1)^{th}$ test data of the second comparator, and further receiving a command code; first through fourth data output circuits, electrically connected to the data combining module, and respectively electrically connected to the first through fourth IOs; wherein according to the command code, the data combining module outputs the compared $i^{th}$ test data to the first and third IOs through the first and third data output circuits and the compared $(i+1)^{th}$ test data to the second and fourth IOs through the second and fourth data output circuits, or outputs the compared $(i+1)^{th}$ test data to the first and third IOs through the first and third data output circuits and the compared $i^{th}$ test data to the second and fourth IOs through the second and fourth data output circuits, wherein i is an odd-numbered integer and i+1 is not larger than a number of the outputs of the chip die.

In an even further embodiment of the present invention, according to the command code, the data combining module outputs a combination of the compared $i^{th}$ test data and the compared $(i+1)^{th}$ test data to the first through fourth IOs through the first through fourth data output circuits.

In an even further embodiment of the present invention, the first and third IOs are electrically connected to each other through a folded probe card, and the second and fourth IOs are electrically connected to each other through the folded probe card.

To sum up, the testing apparatus can be applicable to both testing systems for one and multiple IOs, and by expanding the testing apparatus, the testing apparatus can be used in a folded probe card.

DETAILED DESCRIPTION OF THE PREFERRED EMBODIMENTS

To make it easier for the examiner to understand the objects, characteristics and effects of this present invention, embodiments together with the attached drawings for the detailed description of the present invention are provided.

An embodiment of the present invention provides a testing apparatus comprising multiple data combiners, wherein each of the data combiners is electrically connected to all comparators of the testing apparatus, and compared test data output from the data combiners may be different based upon a command code applied to the data combiner. Thus, the testing apparatus is not only applicable for a probe card of 1 IO in a compress test mode, but also for a probe card of multiple IOs in a compress test mode. Furthermore, in one embodiment of the present invention, the testing apparatus can be expanded to be applicable for a folded probe card in a normal test mode, so as to provide a folded probe card testing system.

Figure 1:
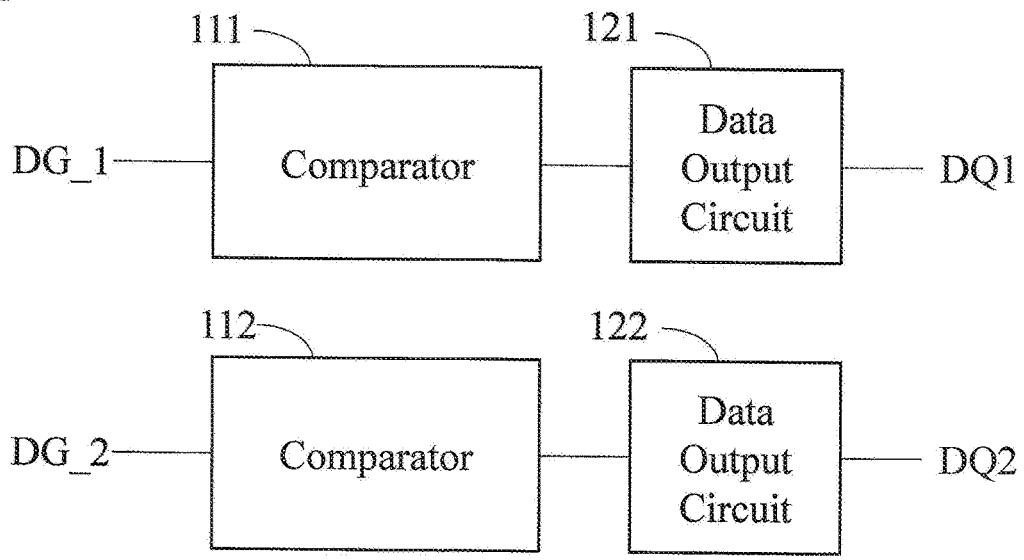
FIG. 1 is a block diagram of a conventional testing apparatus in a testing system.
Figure 2:
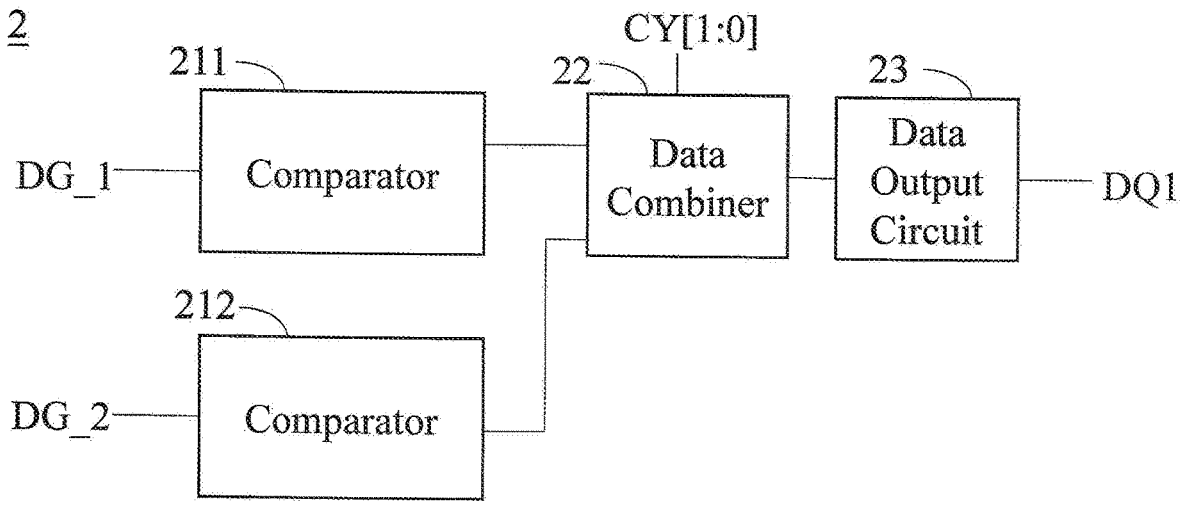
FIG. 2 is a block diagram of another conventional testing apparatus in a testing system.
Figure 3:
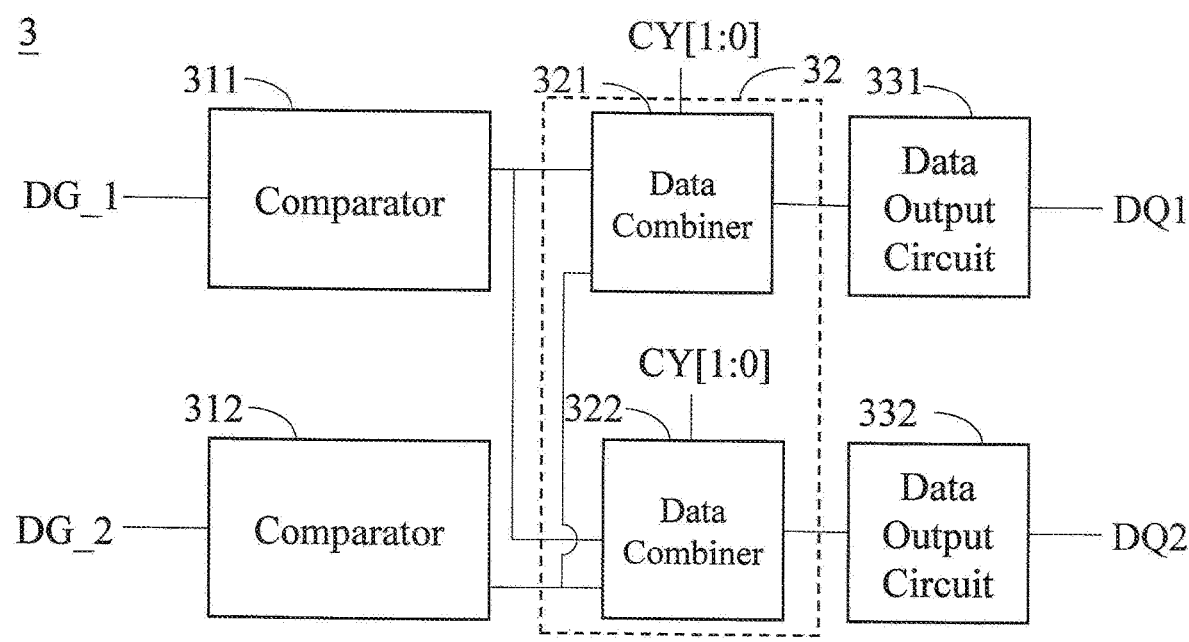
FIG. 3 is a block diagram of a testing apparatus in a testing system according to one embodiment of the present invention.

Referring to FIG. 3, FIG. 3 is a block diagram of a testing apparatus in a testing system according to one embodiment of the present invention. The testing apparatus 3 comprises multiple comparators 311, 312, a data combining module 32 and multiple data output circuits 331, 332. The testing apparatus 3 has two IOs DQ1 and DQ2, for example, but the present invention is not limited thereto. The comparators 311 and 312 are electrically connected to the data combining module 32, the data combining module 32 is electrically connected to the data output circuits 331 and 332, and the data output circuits 331 and 332 are respectively electrically connected to the IOs DQ1 and DQ2. The IOs DQ1 and DQ2 are intended to be connected to a probe card of 2 IOs or 1 IO.

The comparators 311 and 312 respectively receive test data DG_1 and DG_2. The data combining module 32 outputs the compared test data of the comparators 311 and 312 respectively to the data output circuits 331 and 332 when a command code CY[1:0] applied to the data combining module 32 is "10", outputs the compared test data of the comparators 312 and 311 respectively to the data output circuits 331 and 332 when the command code CY[1:0] applied to the data combining module 32 is "01", or outputs the combination of the compared test data of the comparators 312 and 311 to both of the data output circuits 331 and 332 when the command code CY[1:0] applied to the data combining module 32 is "00". That is, the data combining module 32 outputs the compared test data of the comparator 311, the compared test data of the comparator 312 and the combination of the compared test data of the comparators 311, 312 according to the command code CY[1:0].

The data combining module 32 comprises multiple data combiner 321 and 322. The data combiner 321 is electrically connected to the comparators 311 and 312, and the data combiner 322 is electrically connected to the comparators 311 and 312. The data combiners 321 and 322 receive the compared test data of the comparators 311 and 312, and further receive the command code CY[1:0]. When the command code CY[1:0] applied to the data combining module 32 is "00", the data combiners 321 and 322 output the combination of the compared test data of the comparators 311, 312 to the data output circuits 331 and 332. When the command code CY[1:0] applied to the data combining module 32 is "10", the data combiners 321 and 322 output the compared test data of the comparators 311 and 312 respectively to the data output circuits 331 and 332. When the command code CY[1:0] applied to the data combining module 32 is "01", the data combiners 321 and 322 output the compared test data of the comparators 312 and 311 respectively to the data output circuits 331 and 332.

When the probe card of 1 IO is used, the IO of the probe card can be electrically connected one of the IOs DQ1 and DQ2 of the testing apparatus 3, and by identifying the command code CY[1:0], the compared test data of the comparator 311 or 312 which is probed by the probe card of 1 IO can be recognized. For example, if the IO of the probe card is electrically connected to the IO DQ2 of the testing apparatus 3 and the command code CY[1:0] is "10", the compared test data of the comparator 312 is probed. Furthermore, by changing the command code CY[1:0] to be "01", the compared test data of the comparator 311 is probed.

When the probe card of 2 IOs is used, the IOs of the probe card can be respectively electrically connected to the IOs DQ1 and DQ2 (or alternatively, the IOs DQ2 and DQ1) of the testing apparatus 3, and by identifying the command code CY[1:0], the compared test data of the comparators 311 and 312 (or alternatively, 312 and 311) which are probed by the probe card of 2 IOs can be recognized. For example, if the 2 IOs of the probe card are respectively electrically connected to the IOs DQ1 and DQ2 of the testing apparatus 3 and the command code CY[1:0] is "10", the compared test data of the comparators 311 and 312 are respectively probed by the 2 IOs of the probe card. Furthermore, by changing the command code CY[1:0] to be "01", the compared test data of the comparators 312 and 311 are respectively probed by the 2 IOs of the probe card.

It is obvious that the testing apparatus 3 provides the flexibility for probe cards of 1 IO and 2 IOs. Furthermore, for the probe card of 1 IO, one of the IOs DQ1 and DQ2 of the testing apparatus can be selected to electrically connect to the IO of the probe card depending on the situation factors, such space limitation, noise and so on.

Figure 4:
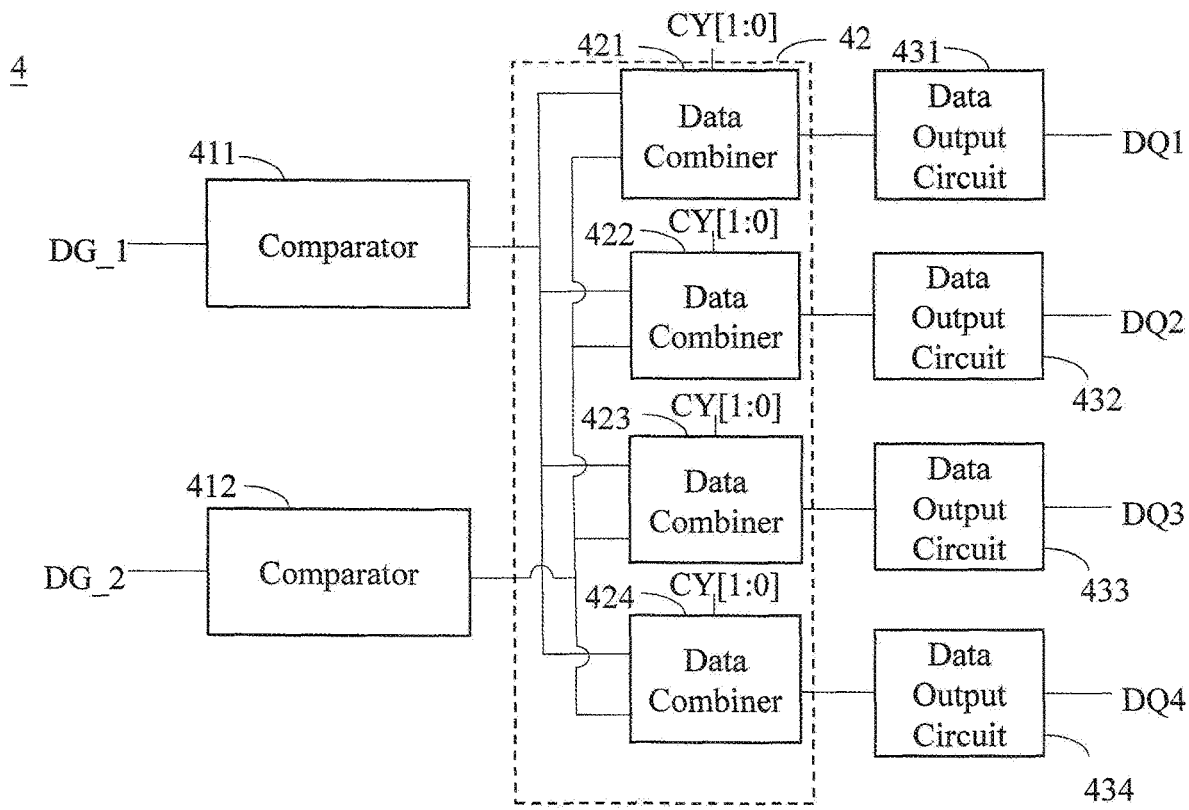
FIG. 4 is a block diagram of a testing apparatus in a testing system according to another embodiment of the present invention.

Referring to FIG. 4, FIG. 4 is a block diagram of a testing apparatus in a testing system according to another embodiment of the present invention. The testing apparatus 4 comprises comparators 411, 412, a data combining module 42 and multiple data output circuits 431 through 434, wherein the comparators 411, 412 are electrically connected to the data combining module 42, and the data combining module 42 is electrically connected to the data output circuits 431 through 434. The testing apparatus 4 further comprises four IOs DQ1, DQ2, DQ3 and DQ4 respectively electrically connected to the data output circuits 431 through 434. The DQ1, DQ2, DQ3 and DQ4 are intended to be connected to a probe card of 410s, 2 IOs or 1 IO.

The comparators 411 and 412 respectively receive test data DG_1 and DG_2 and output the compared test data to the data combining module 42. The data combining module 42 comprises four data combiners 421 through 424, wherein the comparators 411 and 412 are electrically connected to all of the data combiners 421 through 424, and the data combiners 421 through 424 are electrically connected to the data output circuits 431 through 434. The data combiners 421 through 424 further receives a command code CY[1:0]. When the command code CY[1:0] is "00", the data combiners 421 through 424 output the combination of the compared test data of the comparators 411 and 412. When the command code CY[1:0] is "10", the data combiners 421 and 423 output the compared test data of the comparator 411, and the data combiners 422 and 424 output the compared test data of the comparator 412. When the command code CY[1:0] is "01", the data combiners 421 and 423 output the compared test data of the comparator 412, and the data combiners 422 and 424 output the compared test data of the comparator 411.

Figure 5:
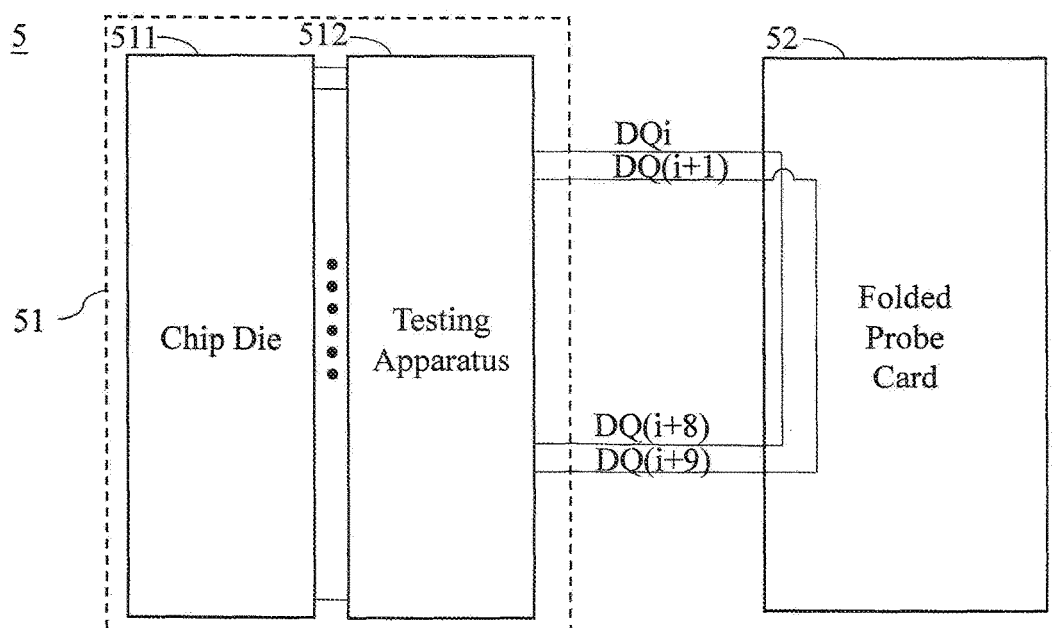
FIG. 5 is a block diagram of a folded probe card testing system according to one embodiment of the present invention.

Referring to FIG. 5, FIG. 5 is a block diagram of a folded probe card testing system according to another embodiment of the present invention. The folded probe card testing system 5 comprises a semiconductor device 51 and a folded probe card 52. The folded probe card 52 has 16 IOs arranged in a rainbow connection manner. That is, the $i^{th}$ IO of the folded probe card 52 is electrically connected to the $(j+8)^{th}$ IO of the folded probe card 52, wherein j is an integer from 1 through 8.

The semiconductor device 51 can have a chip die 511 testing apparatus 512, wherein the two outputs of the 8 outputs of the chip die 511 are electrically connected to the two inputs of the testing apparatus 512. For example, the testing apparatus 512 receives test data DG_i and DG (i+1), wherein i is an integer selected from 1, 3, 5 and 7 (i.e., i is an integer and i+1 is not larger than the number of the outputs of the chip die 511). The semiconductor device 51 can be a memory device and the chip die 511 can be a memory die, but the present invention is not limited thereto. Four IOs DQi, DQ(i+1), DQ(i+8) and DQ(i+9) of the testing apparatus 512 respectively electrically connected to the $j^{th}$, $(j+1)^{th}$, $(j+8)^{th}$ and $(j+9)^{th}$ IOs of the folded probe card 52.

The testing apparatus 512 comprises 2 comparators for receiving the test data DG_i and DG (i+1), a data combining module with 4 data combiners and 4 data output circuits connected to the 4 IOs DQi, DQ(i+1), DQ(i+8) and DQ(i+9). The testing apparatus 512 can be illustrated as follows.

Figure 6:
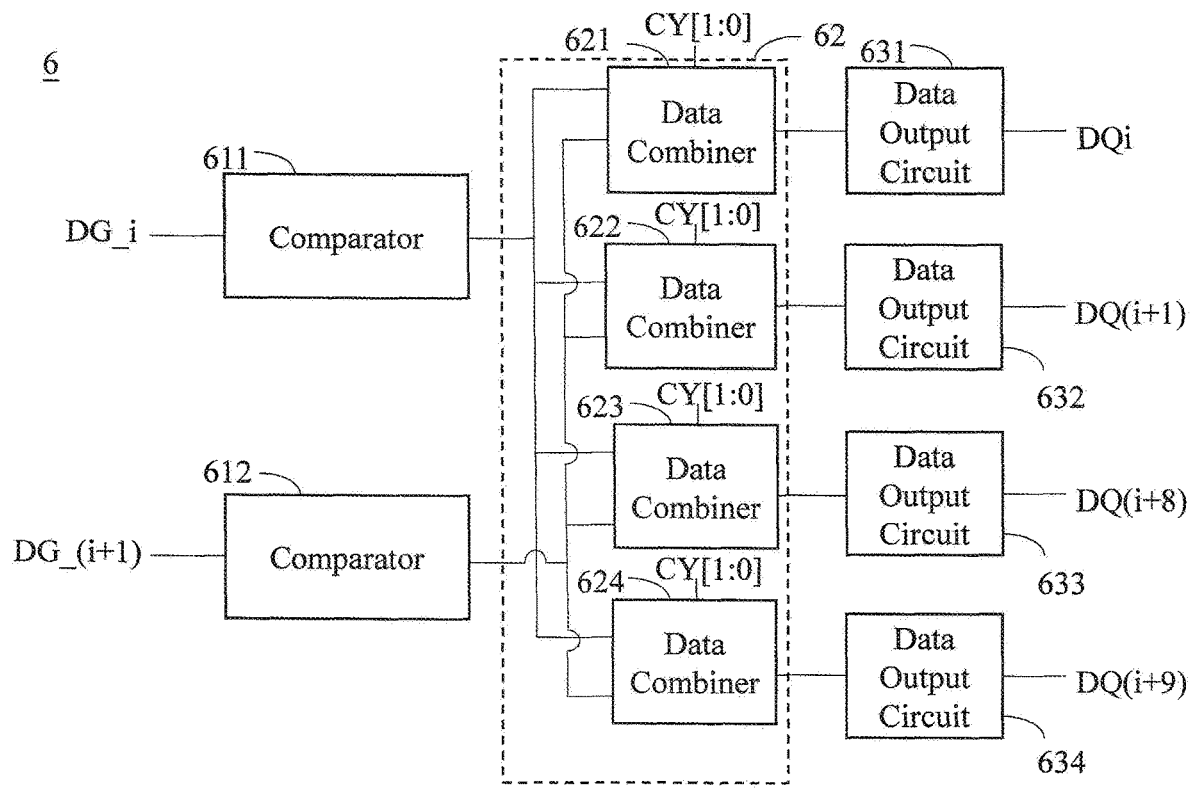
FIG. 6 is a block diagram of a testing apparatus in a folded probe card testing system according to one embodiment of the present invention.

Referring to FIG. 6, FIG. 6 is a block diagram of a testing apparatus in a folded probe card testing system according to one embodiment of the present invention. The testing apparatus 6 comprise comparators 611, 612, four data combiners 621 through 624 in a data combining module 62 and multiple data output circuits 631 through 634, wherein the comparators 611, 612 are electrically connected to the data combining module 62, and the data combining module 62 is electrically connected to the data output circuits 631 through 634. The testing apparatus 6 further comprises IOs DQi, DQ(i+1), DQ(i+8) and DQ(i+9) respectively electrically connected to the $j^{th}$, $(j+1)^{th}$, $(j+8)^{th}$ and $(j+9)^{th}$ IOs of the folded probe card, and the data output circuits 631 through 634 are electrically connected to the IOs DQi, DQ(i+1), DQ(i+8) and DQ(i+9), wherein i is an integer selected from 1, 3, 5 and 7.

The comparators 611 and 612 respectively receive test data DG_i and DG_(i+1) and output the compared test data to the data combining module 62. The data combining module 62 comprises four data combiners 621 through 624, wherein the comparators 611 and 612 are electrically connected to all of the data combiners 621 through 624, and the data combiners 621 through 624 are electrically connected to the data output circuits 631 through 634. The data combiners 621 through 624 further receive a command code CY[1:0]. When the command code CY[1:0] is "00", the data combiners 621 through 624 output the combination of the compared test data of the comparators 611 and 612. When the command code CY[1:0] is "10", the data combiners 621 and 623 output the compared test data of the comparator 611, and the data combiners 622 and 624 output the compared test data of the comparator 612. When the command code CY[1:0] is "01", the data combiners 621 and 623 output the compared test data of the comparator 612, and the data combiners 622 and 624 output the compared test data of the comparator 611.

Figure 7:
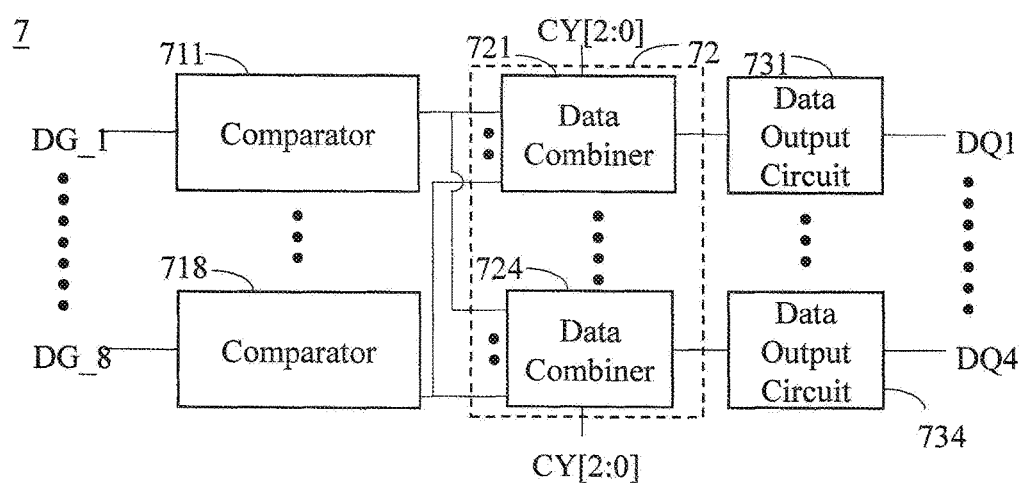
FIG. 7 is a block diagram of a testing apparatus in a testing system according to another embodiment of the present invention.

Referring to FIG. 7, FIG. 7 is a block diagram of a testing apparatus in a testing system according to another one embodiment of the present invention. The testing apparatus 7 comprises multiple comparators 711 through 718, a data combining module 72 and multiple data output circuits 731 through 734. The testing apparatus 7 has four IOs DQ1 through DQ4 for example, but the present invention is not limited thereto. The comparators 711 through 718 are electrically connected to the data combining module 72, the data combining module 72 is electrically connected to the data output circuits 431 through 434, and the data output circuits 731 through 734 are respectively electrically connected to the IOs DQ1 through DQ4. The IOs DQ1 through DQ4 are intended to be connected to a probe card of 4 IOs, 2 IOs or 1 IO.

The data combining module 72 comprises multiple data combiners 721 through 724, wherein the data combiners 721 through 724 are electrically connected to the comparators 711 through 718 to receive the compared test data of the comparators 711 through 718, and respectively connected to the data output circuits 731 through 734. The data combiners 721 through 724 further receives the command code CY[2:0] and outputs one of the compared test data of the comparators 711 through 718 to the data output circuits 731 through 734 respectively.

For example, when the command code CY[2:0] is "000", the data combiners 721 through 724 respectively output the compared test data of the comparators 711, 712, 713 and 714. When the command code CY[2:0] is "001", the data combiners 721 through 724 respectively output the compared test data of the comparators 712, 711, 714 and 713. When the command code CY[2:0] is "010", the data combiners 721 through 724 respectively output the compared test data of the comparators 713, 714, 711 and 712. When the command code CY[2:0] is "011", the data combiners 721 through 724 respectively output the compared test data of the comparators 714, 713, 712 and 711. When the command code CY[2:0] is "100", the data combiners 721 through 724 respectively outputs the compared test data of the comparators 715, 716, 717 and 718. When the command code CY[2:0] is "101", the data combiners 721 through 724 respectively output the compared test data of the comparators 716, 715, 718 and 717. When the command code CY[2:0] is "110", the data combiners 721 through 724 respectively output the compared test data of the comparators 717, 718, 715 and 716. When the command code CY[2:0] is "111", the data combiners 721 through 724 respectively output the compared test data of the comparators 718, 717, 716 and 715.

It is noted that, if the probe card merely has 2 IOs, the IOs of the probe card can be electrically connected to the IOs DQ1 and DQ4 of the testing apparatus 7, and the compared test data of the comparators 711 through 718 can be probed when the command code CY[2:0] of "000", "001", "100" and "101" is applied to the data combiners 721 through 724. Furthermore, when the semiconductor memory is under test, the command code CY[2:0] can be a portion of the column code of the semiconductor memory, wherein the portion of the column code may not be used in the semiconductor memory. Thus, no additional code generator for the command code CY[2:0] is required.

In conclusion, at least one of the above provided testing apparatuses can be applicable to both testing systems for one and multiple IOs in a compress test mode (i.e., the flexibility for probe cards of one and multiple IOs), and at least one of the above provided testing apparatuses can be used in a folded probe card testing system for a normal test mode.

While the present invention has been described by means of specific embodiments, numerous modifications and variations could be made thereto by those skilled in the art without departing from the scope and spirit of the present invention set forth in the claims.

What is claimed is:
1. A testing apparatus, comprising:
a first input-output (IO) and a second IO;
a first comparator, receiving first test data;
a second comparator, receiving second test data;
a data combining module, electrically connected to the first and second comparators, receiving compared first test data of the first comparator and compared second test data of the second comparator, and further receiving a command code;
a first data output circuit, electrically connected to the first IO and the data combining module;
a second data output circuit, electrically connected to the second IO and the data combining module;
wherein according to the command code, the data combining module outputs the compared first test data and the compared second test data respectively to the first and second IOs through the first and second data output circuits, or outputs the compared second test data and the compared first test data respectively to the first and second IOs through the first and second data output circuits.

2. The testing apparatus according to claim 1, wherein according to the command code, the data combining module outputs combination of the compared first test data and the compared second test data to the first and second IOs through the first and second data output circuits.

3. The testing apparatus according to claim 1, wherein the data combining module comprises a first and second data combiners, the first and second comparators are electrically connected to all of the first and second data combiners, and the first and second data combiners are respectively connected to the first and second data output circuits, wherein the command code is applied to the first and second data combiners.

4. The testing apparatus according to claim 1 further comprising:
a third and fourth IOs;
a third and fourth data output circuits, respectively electrically connected to the third and fourth IOs, and further electrically connected to the data combining module;
wherein according to the command code, the data combining module outputs the compared first test data of the first comparators to the first and third IOs through the first and third data output circuits and the compared second test data of the second comparators to the second and fourth IOs through the second and fourth data output circuits, or outputs the compared first test data of the first comparators to the second and fourth IOs through the second and fourth data output circuits and the compared second test data of the second comparators to the first and third IOs through the first and third data output circuits, or outputs combination of the compared first test data and the compared second test data to the first through fourth IOs through the first and fourth data output circuits.

5. The testing apparatus according to claim 1, further comprising:
a third and fourth IOs;
a third through eighth comparators, respectively receiving third through eighth test data; and
a third and fourth data output circuits, respectively electrically connected to the third and fourth IOs, and further electrically connected to the data combining module;
wherein according to the command code, the data combining module outputs fours of the compared first through eighth test data of the first through eighth comparators to the first through fourth IOs through the first through fourth data output circuits.

6. The testing apparatus according to claim 5, the data combining module comprises a first through fourth data combiners, the first through eighth comparators are electrically connected to all of the first through fourth data combiners, and the first through fourth data combiners are respectively connected to the first through fourth data output circuits, wherein the command code is applied to the first through fourth data combiners.

7. A testing apparatus, comprising:
a first through fourth IOs;
a first comparator, receiving $i^{th}$ test data from a chip die;
a second comparator, receiving $(i+1)^{th}$ test data from the chip die;
a data combining module, electrically connected to the first and second comparators, receiving compared $i^{th}$ test data of the first comparator and compared $(i+1)^{th}$ test data of the second comparator, and further receiving a command code;
a first through fourth data output circuits, electrically connected to the data combining module, and respectively electrically connected to the first through fourth IOs;
wherein according to the command code, the data combining module outputs the compared $i^{th}$ test data to the first and third IOs through the first and third data output circuits and the compared $(i+1)^{th}$ test data to the second and fourth IOs through the second and fourth data output circuits, or outputs the compared $(i+1)^{th}$ test data to the first and third IOs through the first and third data output circuits and the compared $i^{th}$ test data to the second and fourth IOs through the second and fourth data output circuits, wherein i is an integer being an odd number and i+1 is not larger than a number of the outputs of the chip die.

8. The testing apparatus according to claim 7, wherein according to the command code, the data combining module outputs combination of the compared $i^{th}$ and $(i+1)^{th}$ test data to the first through fourth IOs through the first through fourth data output circuits.

9. The testing apparatus according to claim 7, wherein the first and third IOs are electrically connected to each other through a folded probe card, and the second and fourth IOs are electrically connected to each other through the folded probe card.

10. A folded probe card testing system, comprising:
a testing apparatus; and
a folded probe card, electrically connected to the testing apparatus;
wherein the testing apparatuses comprises:
a first through fourth IOs;
a first comparator, receiving $i^{th}$ test data from a chip die;
a second comparator, receiving $(i+1)^{th}$ test data from the chip die;
a data combining module, electrically connected to the first and second comparators, receiving compared $i^{th}$ test data of the first comparator and compared $(i+1)^{th}$ test data of the second comparator, and further receiving a command code;
a first through fourth data output circuits, electrically connected to the data combining module, and respectively electrically connected to the first through fourth IOs;
wherein according to the command code, the data combining module outputs the compared $i^{th}$ test data to the first and third IOs through the first and third data output circuits and the compared $(i+1)^{th}$ test data to the second and fourth IOs through the second and fourth data output circuits, or outputs the compared (i+1) test data to the first and third IOs through the first and third data output circuits and the compared $i^{th}$ test data to the second and fourth IOs through the second and fourth data output circuits, wherein i is an integer being an odd number and i+1 is not larger than a number of the outputs of the chip die.

11. The folded probe card testing system according to claim 10, wherein according to the command code, the data combining module outputs combination of the compared $i^{th}$ and $(i+1)^{th}$ test data to the first through fourth IOs through the first through fourth data output circuits.

12. The folded probe card testing system according to claim 10, wherein the first and third IOs are electrically connected to each other through a folded probe card, and the second and fourth IOs are electrically connected to each other through the folded probe card.

* * * * *